(12) United States Patent
Ishikawa et al.

(10) Patent No.: US 11,715,629 B2
(45) Date of Patent: Aug. 1, 2023

(54) PLASMA PROCESSING DEVICE MEMBER, PLASMA PROCESSING DEVICE COMPRISING SAID PLASMA PROCESSING DEVICE MEMBER, AND METHOD FOR MANUFACTURING PLASMA PROCESSING DEVICE MEMBER

(71) Applicant: KYOCERA Corporation, Kyoto (JP)

(72) Inventors: Kazuhiro Ishikawa, Shiga (JP); Takashi Hino, Yokohama (JP); Shuichi Saito, Yokohama (JP)

(73) Assignee: KYOCERA CORPORATION, Kyoto (JP)

( * ) Notice: Subject to any disclaimer, the term of this patent is extended or adjusted under 35 U.S.C. 154(b) by 114 days.

(21) Appl. No.: 17/043,908

(22) PCT Filed: Apr. 3, 2019

(86) PCT No.: PCT/JP2019/014874
§ 371 (c)(1),
(2) Date: Sep. 30, 2020

(87) PCT Pub. No.: WO2019/194247
PCT Pub. Date: Oct. 10, 2019

(65) Prior Publication Data
US 2021/0020415 A1 Jan. 21, 2021

(30) Foreign Application Priority Data

Apr. 3, 2018 (JP) .................................. 2018-071705
Jul. 4, 2018 (JP) .................................. 2018-127639

(51) Int. Cl.
*C23C 14/08* (2006.01)
*B32B 18/00* (2006.01)
(Continued)

(52) U.S. Cl.
CPC ........ *H01J 37/32477* (2013.01); *B32B 18/00* (2013.01); *C04B 41/009* (2013.01);
(Continued)

(58) Field of Classification Search
None
See application file for complete search history.

(56) References Cited

U.S. PATENT DOCUMENTS

| | | |
|---|---|---|
| 10,941,303 B2 | 3/2021 | Larsson et al. |
| 2002/0018921 A1 | 2/2002 | Yamada et al. |

(Continued)

FOREIGN PATENT DOCUMENTS

| | | | |
|---|---|---|---|
| JP | 2002-1865 A | | 1/2002 |
| JP | 2002087878 A | * | 3/2002 |

(Continued)

OTHER PUBLICATIONS

Translation—JP-2002087878-A; Aoki et al.; Mar. 2002 (Year: 2002).*

*Primary Examiner* — Humera N. Sheikh
*Assistant Examiner* — Elizabeth D Ivey
(74) *Attorney, Agent, or Firm* — Procopio Cory Hargreaves and Savitch LLP

(57) ABSTRACT

A plasma processing device member according to the disclosure includes a base material and a film formed of an oxide, or fluoride, or oxyfluoride, or nitride of a rare-earth element, the film being disposed on at least part of the base material, the film including a surface to be exposed to plasma, the surface having an area occupancy of open pores of 8% by area or more, and an average diameter of open pores of 8 μm or less.

7 Claims, 3 Drawing Sheets

(51) Int. Cl.

| | |
|---|---|
| *H01J 37/32* | (2006.01) |
| *C23C 16/455* | (2006.01) |
| *H01L 21/02* | (2006.01) |
| *H01L 21/3065* | (2006.01) |
| *C04B 41/00* | (2006.01) |
| *C04B 41/50* | (2006.01) |

(52) U.S. Cl.
CPC ...... *C04B 41/5045* (2013.01); *C04B 41/5055* (2013.01); *C23C 14/083* (2013.01); *C23C 16/45536* (2013.01); *H01L 21/02252* (2013.01); *H01L 21/3065* (2013.01)

(56) References Cited

U.S. PATENT DOCUMENTS

| | | | |
|---|---|---|---|
| 2013/0251949 A1* | 9/2013 | Sato | H01J 37/32477 428/323 |
| 2018/0105701 A1* | 4/2018 | Larsson | H01J 37/32495 |
| 2018/0135157 A1 | 5/2018 | Jeong et al. | |

FOREIGN PATENT DOCUMENTS

| | | |
|---|---|---|
| JP | 2005-217349 A | 8/2005 |
| JP | 2009-161848 A | 7/2009 |
| JP | 2009287058 A | 12/2009 |
| KR | 1020170080123 A1 | 7/2017 |

\* cited by examiner

PLASMA PROCESSING DEVICE MEMBER, PLASMA PROCESSING DEVICE COMPRISING SAID PLASMA PROCESSING DEVICE MEMBER, AND METHOD FOR MANUFACTURING PLASMA PROCESSING DEVICE MEMBER

CROSS-REFERENCE TO RELATED APPLICATIONS

This application is a national stage entry according to 35 U.S.C. 371 of International Application No. PCT/JP2019/014874 filed on Apr. 3, 2019, which claims priority to Japanese Patent Application Nos. 2018-071705 filed on Apr. 3, 2018, and 2018-127639 filed on Jul. 4, 2018, the contents of which are entirely incorporated herein by reference.

TECHNICAL FIELD

The present disclosure relates to a plasma processing device member, a plasma processing device including the plasma processing device member, and a method for manufacturing a plasma processing device member.

BACKGROUND

As one of members required to have high plasma resistance, use has heretofore been made of a plasma processing device member including a base material and a film formed of an yttrium oxide, the film being disposed on the base material. In such a film, a low porosity (low area occupancy of open pores) of its surface to be exposed to plasma (which may also be hereinafter called merely "surface") is required in the interest of greater plasma resistance.

For example, Japanese Unexamined Patent Publication JP-A 2009-161848 (Patent Literature 1) proposes a plasma processing container interior member which includes a ceramic base material, a $Y_2O_3$ sprayed coating having a porosity of 5% or more on a surface of the ceramic base material by atmospheric plasma spraying, and a $Y_2O_3$ sprayed coating having a porosity of less than 5% overlying the above-described sprayed coating.

SUMMARY

A plasma processing device member according to the disclosure includes a base material and a film formed of an oxide, or fluoride, or oxyfluoride, or nitride of a rare-earth element, the film being disposed on at least part of the base material. The film includes a surface to be exposed to plasma, the surface have an area occupancy of open pores of 8% by area or more, and an average diameter of open pores of 8 μm or less.

A plasma processing device according to the disclosure includes the plasma processing device member described above.

A method for manufacturing a plasma processing device member according to the disclosure includes: forming a first layer including an yttrium oxide as a main component on a base material by a sputtering method; applying smoothing processing to a film formation surface of the first layer; and forming a second layer including an yttrium oxide as a main component on a smoothing-processed surface of the first layer by a sputtering method.

BRIEF DESCRIPTION OF DRAWINGS

Other and further objects, features, and advantages of the disclosure will be more explicit from the following detailed description taken with reference to the drawings wherein.

DETAILED DESCRIPTION

A plasma processing device member according to the disclosure will now be described in detail with reference to drawings.

Figure 1A:
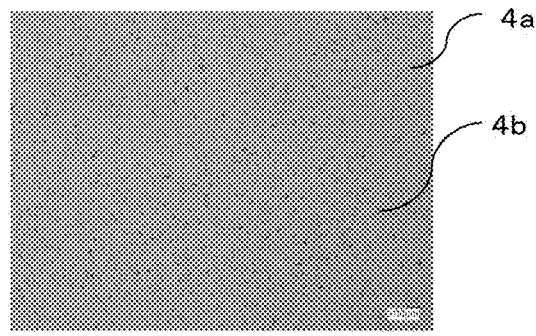
FIG. 1A is a photograph of a surface to be exposed to plasma of a plasma processing device member in accordance with one embodiment of the disclosure taken by an optical microscope.
Figure 1B:
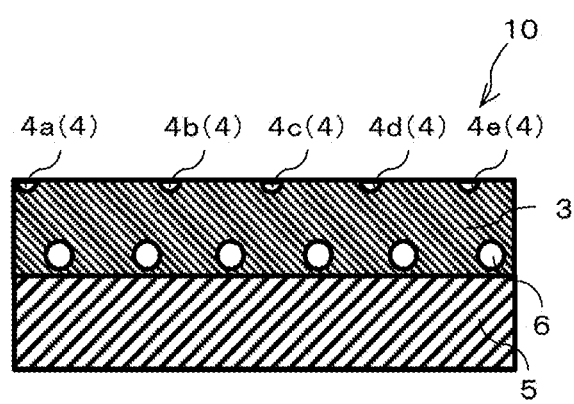
FIG. 1B is a sectional view schematically showing the plasma processing device member in accordance with one embodiment of the disclosure.

FIG. 1A is a photograph of a surface to be exposed to plasma of the plasma processing device member according to the disclosure taken by an optical microscope. FIG. 1B is a sectional view schematically showing the plasma processing device member. FIG. 3C is a sectional view schematically showing another example of the plasma processing device member.

Figure 1C:
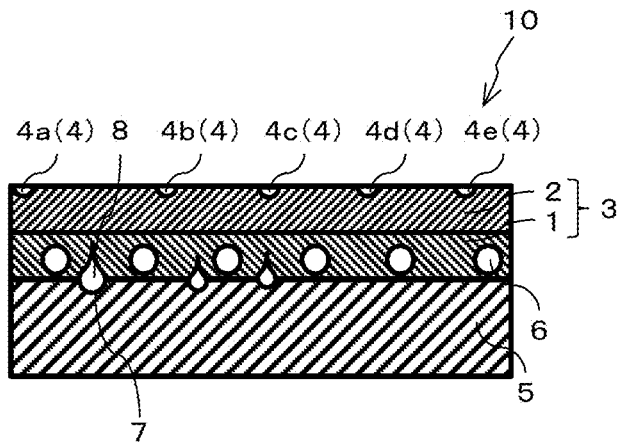
FIG. 1C is a sectional view schematically showing another example of the plasma processing device member in accordance with one embodiment of the disclosure.

A plasma processing device member 10 according to the disclosure includes a base material 5 and a film 3 formed of a rare-earth element oxide, the film 3 being disposed on at least part of the base material 5. The surface to be exposed to plasma of the film 3 is provided with a plurality of open pores 4. FIGS. 1A to 1C show an example in which the surface is provided with a plurality of open pores 4a, 4b, . . . , and show an example in which an interior of the film 3 is provided with a plurality of closed pores 6.

Moreover, FIG. 1C shows the film 3 including a first layer (lower layer) 1 located on the base material 5 and a second layer (upper layer) 2 located on the first layer (lower layer) 1. For example, the ratio between a thickness $t_1$ of the first layer 1 and a thickness $t_2$ of the second layer 2, given as: $t_1:t_2$, stands at 4 to 6:6 to 4.

Examples of the base material 5 include quartz, aluminum with a purity of 99.999% (5N) or more, an aluminum alloy such as aluminum 6061 alloy, aluminum nitride ceramics, and aluminum oxide ceramics. The aluminum nitride ceramic refers to ceramics including an aluminum nitride content, i.e. the content of AlN-equivalent Al, of 90% by mass or more based on 100% by mass of the constituents of the base material 5 in all. Moreover, the aluminum oxide ceramics refers to ceramics including an aluminum oxide content, i.e. the content of $Al_2O_3$-equivalent Al, of 90% by mass or more based on 100% by mass of the constituents of the base material 5 in all. Note that the aluminum oxide ceramics may contain magnesium oxide, calcium oxide, silicon oxide, etc. in addition to aluminum oxide.

The film 3 is formed of a rare-earth element oxide. Examples of the rare-earth element include yttrium (Y), cerium (Ce), samarium (Sm), gadolinium (Gd), dysprosium (Dy), erbium (Er), and ytterbium (Yb). Yttrium, in particular, is highly resistant to corrosion yet less expensive than other rare-earth elements. Thus, the use of yttrium as the rare-earth element leads to a high degree of cost effectiveness.

The film 3 is not limited to those containing rare-earth element oxides only. Depending on the purity of a target used in a film 3-forming process, the device structure, etc., the film 3 may contain other elements than the rare-earth element, such as fluorine (F), sodium (Na), magnesium (Mg), aluminum (Al), silicon (Si), phosphorus (P), sulfur (S), chlorine (Cl), potassium (K), calcium (Ca), titanium (Ti), chromium (Cr), manganese (Mn), iron (Fe), cobalt (Co), nickel (Ni), copper (Cu), zinc (Zn), and strontium (Sr).

The thickness of the film 3 is 10 μm or more and 200 μm or less, and the micro-Vickers hardness HmV of the film 3 is 7.5 GPa or more. Moreover, for example, given that the rare-earth element is yttrium, the film may include, as a main component, an oxygen-deficient yttrium oxide expressed as: $Y_2O_{3-x}$ ($0 \leq x < 1$). The yttrium oxide expressed by the compositional formula given above exhibits semiconductivity, and it is thus possible to suppress surface charging of the film 3.

The constituents of the base material 5, as well as the constituents of the film 3, may be identified by X-ray diffractometer using CuKα radiation. For example, the content of each constituent may be determined by ICP (Inductively Coupled Plasma) optical emission spectrometer or X-ray fluorescence analyzer.

The plasma processing device member according to the disclosure includes the film 3 in which an area occupancy of the open pores 4 at the surface to be exposed to plasma is 8% by area or less, and an average diameter of the open pores 4 is 8 μm or less.

This structural design permits formation of fewer open pores 4 of smaller size at the surface to be exposed to plasma. Thus, the plasma processing device member according to the disclosure has superior plasma resistance. Moreover, since the number of particles generated from within the open pores 4 is small and the size of generated particles is small, it is possible to use the plasma processing device member for a longer period of time, and hence a plasma processing device provided with the plasma processing device member according to the disclosure is highly reliable.

A procedure for determining the average diameter and the area occupancy of the open pores 4 of the film 3 is as follows. The surface to be exposed to plasma is defined as a surface of measurement. Digital Microscope (VHX-5000 Series) manufactured by KEYENCE CORPORATION is set for incident-light illumination technique of coaxial incident illumination, illumination intensity of 255, and ZS20 lens, which corresponds to an objective lens, at 100-fold magnification. Then, dark spots (corresponding to the open pores) are extracted from an image of a 7.223 mm² area (3.1 mm in transverse length and 2.33 mm in longitudinal length) of the surface of measurement obtained at a selected brightness level in an automatic area measurement mode. After that, for example, with a threshold set to −20, the average diameter and the area occupancy of the open pores in the film 3 can be calculated. Note that the value of the threshold may be adjusted according to the lightness of the dark spots.

The area occupancy of the open pores 4 at the surface to be exposed to plasma may be 4% by area or less, and the average diameter of the open pores 4 may be 4 μm or less.

Moreover, the film 3 may be configured so that a region in which the average diameter of the open pores 4 is 8 μm or less and the area occupancy of the open pores 4 from the surface of the film 3 is 8% by area or less constitutes 5% or more of the entire thickness dimension of the film 3. Although the area occupancy of the open pores 4 basically applies only to open pores at the surface to be exposed to plasma, for the sake of calculation of area occupancy, pores that appear on the surface during a surface grinding process are also defined as the open pores 4.

In the plasma processing device member 10 as exemplified in FIG. 1C, the above described region corresponds to the second layer 2. That is, in the case where the region in which the average diameter of the open pores 4 is 8 μm or less and the area occupancy of the open pores 4 is 8% by area or less is configured not only to exist in the surface but also to extend inwardly from the surface, even in a part of the film which becomes exposed as a fresh surface under exposure to plasma, the number of particles generated from within the open pores 4 is small and the size of generated particles is small. This makes it possible to carry out satisfactory plasma processing for a longer period of time. The lower limit of the average diameter of the open pores 4, while not limited to a particular value, is preferably greater than or equal to 0.5 μm. Too small an open pore 4 size may impair the advantage of the inclusion of the open pores. Moreover, the lower limit of the area occupancy of the open pores 4, while not limited to a particular value, is preferably greater than or equal to 0.5%. Too small an open pore area occupancy may impair the advantage of the inclusion of the open pores.

Moreover, the film 3 may be provided with a cavity 8 which extends in a thickness direction thereof from a recess 7 located at the film 3-facing surface of the base material 5, and the cavity 8 may terminate within the film 3. As used herein the recess 7 refers to an open pore or cavity present at the film 3-facing surface of the base material 5, and also refers, prior to the formation of the film 3, to the surface of the base material 5.

When the film 3 is provided with the cavity 8, accumulation of residual stress can be restrained even under repeated rise and fall in temperature, and due to the cavity 8 lacking communication with the exterior thereof, it never occurs that particles within the cavity 8 go out of the film 3.

Moreover, a width at a part of the cavity 8 which is located close to the surface of the film 3 may be smaller than a width at a part of the cavity 8 which is located close to the recess 7 of the base material 5, as viewed in a section taken along the thickness of the film 3. With this configuration, even if the tip of the cavity 8 opens on the surface of the film 3 due to a decrease in film thickness under exposure to plasma, particles within the cavity 8 is less likely to go out of the film 3, as contrasted to a configuration such that the width at the part of the cavity 8 which is located close to the surface of the film 3 is larger than the width at the part of the cavity 8 which is located close to the recess 7 of the base material 5.

Moreover, the base material 5 formed of ceramics which includes aluminum oxide as a main component may contain at least one of yttrium aluminum garnet (YAG), yttrium aluminum monoclinic (YAM), and yttrium aluminum perovskite (YAP) in the top of the film 3-facing covered surface thereof.

This structural design permits enhanced chemical bonding of the film 3 with the base material 5, and thus allows the film 3 to adhere more firmly to the base material 5.

The following describes a method for manufacturing a plasma processing device member according to the disclosure.

A method for producing the base material will be described first.

Aluminum oxide ($Al_2O_3$) A powder having an average particle size of 0.4 μm to 0.6 μm, and aluminum oxide B powder having an average particle size of about 1.2 μm to 1.8 μm. Silicon oxide ($SiO_2$) powder as a Si source, and calcium carbonate ($CaCO_3$) powder as a Ca source are also prepared. As the silicon oxide powder, fine powdery silicon oxide having an average particle size of 0.5 μm or less is prepared. Moreover, magnesium hydroxide powder is used to obtain Mg-containing alumina ceramics. Note that other powdery materials than the aluminum oxide A powder and the aluminum oxide B powder will be hereinafter collectively called "first secondary component powder".

A predetermined amount of each first secondary component powder is weighed out. After that, an aluminum oxide powder mixture is prepared from the aluminum oxide A powder and the aluminum oxide B powder in the amounts weighed out so that a mixture composed of the aluminum oxide A powder and the aluminum oxide B powder in mass proportions ranging from 40:60 to 60:40 can be obtained, and that the resulting alumina ceramics contains Al, as an $Al_2O_3$-equivalent aluminum, in an amount of 99.4% by mass or more based on 100% by mass of the alumina ceramics constituents in all. Moreover, for preparation of the first secondary component powder, preferably, on the basis of the measured amount of Na in the aluminum oxide powder mixture, certain amounts of the first secondary component powder are weighed out so that the amount ratio between $Na_2O$ derived by conversion of the Na amount and the sum of the constituents of the first secondary component powder (Si, Ca, etc. in this exemplification) on an oxide basis stands at or below 1.1 in the resulting alumina ceramics.

Then, a slurry is prepared by mixing and stirring, in a stirrer, the alumina powder mixture and the first secondary component powder, with the following components added: 1 to 1.5 parts by mass of a binder such as PVA (polyvinyl alcohol); 100 parts by mass of a solvent; and 0.1 to 0.55 parts by mass of a dispersant, based on 100 parts by mass of the alumina powder mixture and the first secondary component powder in all.

The slurry is spray-dried into granules, and the granules are shaped into a molded body of predetermined shape by a powder press molding apparatus, an isostatic pressing apparatus or the like. The molded body is subjected to cutting work on an as needed basis. Thus, a molded product in substrate form is obtained.

Subsequently, the molded product is fired while being retained under the following conditions: a firing temperature of 1500° C. or higher and 1700° C. or lower; and the duration of retention time of four hours or longer and six hours or shorter. After that, the molded product is ground at a surface thereof where the film is to be formed by using diamond abrasive grains having an average particle size of 1 μm or more and 5 μm or less, and a tin-made surface grinder. Thus, the base material 5 can be obtained.

Figure 2:
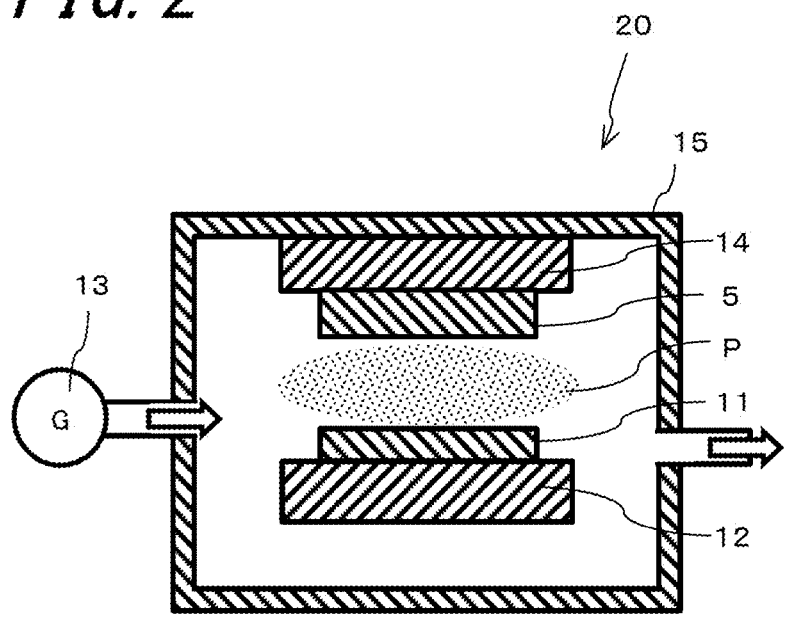
FIG. 2 is a schematic diagram of a sputtering apparatus used to obtain the plasma processing device member in accordance with one embodiment of the disclosure.

Next, a method for forming the film will be described with reference to FIG. 2. FIG. 2 is a schematic diagram showing a sputtering apparatus 20, and the sputtering apparatus 20 includes: a chamber 15; a gas supply source 13 connected in communication with the interior of the chamber 15; an anode 14 and a cathode 12 which are disposed within the chamber 15; and a target 11 connected to the cathode 12 side.

A procedure for forming the film is as follows. The base material 5 obtained in the above-described manner is placed on the anode 14 side within the chamber 15. Moreover, the target 11 including, as a main component, a rare-earth element, or more specifically yttrium metal in this example, is placed on the opposite side, i.e. on the cathode 12 side, within the chamber 15. In this state, the interior of the chamber 15 is brought under a reduced pressure by the operation of a vacuum pump, and, the gas supply source 13 supplies argon and oxygen as a gas G.

After that, a film of yttrium metal is formed on the surface of the base material 5 by sputtering in the presence of plasma P generated with the application of an electric field between the anode 14 and the cathode 12 via a power supply. A film portion formed in one operation has a thickness on the order of subnanometers. Subsequently, the yttrium metal film is subjected to an oxidizing process. A laminate having a total film thickness of 10 μm or more and 200 μm or less is produced by alternately carrying out the yttrium metal film-forming process and the oxidizing process. Thus, the first layer 1 can be obtained.

In order to obtain the plasma processing device member containing at least one of yttrium aluminum garnet (YAG), yttrium aluminum monoclinic (YAM), and yttrium aluminum perovskite (YAP) on a film-facing surface of the base material 5, the temperature of the base material 5 should preferably be set at 400° C. or higher in the sputtering process. Any of high-frequency power and DC power may be used as electric power which is provided via the power supply.

After taking the base material 5 provided with the first layer 1 out of the chamber 15, smoothing processing is applied to a film formation surface of the first layer 1. As used herein the smoothing processing refers to, for example, a grinding process for grinding the film formation surface of the first layer 1 into a treated surface (polished surface) with diamond abrasive grains having an average particle size of 1 μm or more and 5 μm or less, and a tin-made surface grinder.

In order to obtain the plasma processing device member 10 including the cavity 8 which extends in the thickness direction from the recess 7 located at the film-facing surface of the base material 5 and which terminates within the film 3, the provision of the base material 5 including the film-facing surface with open pores 4 having an average diameter of 1 μm or more and 8 μm or less, and the process of grinding the film formation surface of the first layer 1 until the average diameter of open pores becomes 0.1 μm or more and 5 μm or less, should preferably be carried out.

Moreover, when a film on the base material 5 including the film-facing surface with open pores having an average diameter of 1 μm or more and 8 μm or less is formed by means of the sputtering apparatus 20 as shown in FIG. 2, the width at the part of the cavity 8 which is located close to the surface of the film is smaller than the width at the part of the cavity 8 which is located close to the recess 7 of the base material 5, as viewed in the section taken along the thickness of the film 3. Moreover, when the film formation surface of the first layer 1 is ground until the average diameter of open pores becomes 0.1 μm or more and 5 μm or less, and the second layer 2 is formed as will hereafter be described, the cavity 8 is closed within the film 3.

The second layer 2 including an yttrium oxide as a main component is formed on the treated surface of the first layer 1 in the same manner as that for forming the first layer 1. Thus, the plasma processing device member 10 according to the disclosure can be obtained.

The plasma processing device member 10 according to the disclosure obtained by the above-described manufacturing method can achieve the reduced number of particles generated from within the open pores and the small size of generated particles, and is thus applicable to, for example, a radio-frequency transmissive window member that allows radio-frequency radiation for plasma generation to pass therethrough, a shower plate for distribution of gas for plasma production, and a susceptor for holding semiconductor wafers.

A plasma processing device member in accordance with another embodiment of the disclosure will now be described in detail with reference to drawings.

Figure 3A:
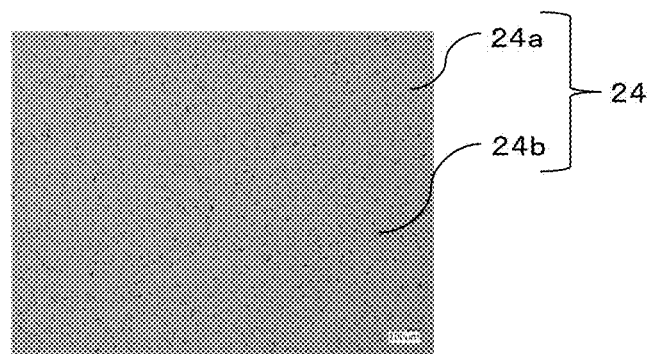
FIG. 3A is a photograph of a surface to be exposed to plasma of a plasma processing device member in accordance with another embodiment of the disclosure taken by an optical microscope.
Figure 3B:
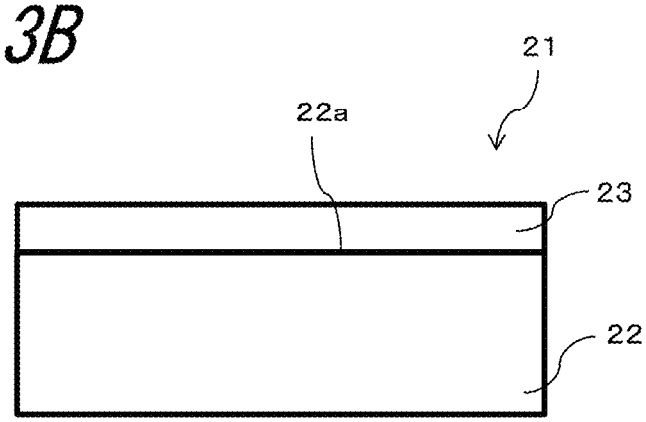
FIG. 3B is a side view showing the plasma processing device member in accordance with another embodiment of the disclosure.

As shown in FIG. 3B, a plasma processing device member 21 according to the disclosure includes a base material 22 and a film 23 formed of a rare-earth element oxide, or a rare-earth element fluoride, or a rare-earth element oxyfluoride, or a rare-earth element nitride, the film 23 being disposed on at least part of the base material 22. FIG. 3B shows an example in which one upper surface 22a of the base material 22 is covered with the film 23.

A surface to be exposed to plasma of the film 23 (upper surface as viewed in FIG. 3B, which may also be hereinafter called merely "surface"), has an arithmetic mean roughness Ra of 0.01 µm or more and 0.1 µm or less. In addition, the surface is provided with a plurality of pores 24. FIG. 3A shows the surface provided with a plurality of pores 24a, 24b, . . . . The surface to be exposed to plasma of the film 23 is construed as encompassing a part of the film 23 which becomes exposed as a fresh surface due to a decrease in film thickness under exposure to plasma.

The arithmetic mean surface roughness Ra may be determined in conformance with JIS B 0601-2013. More specifically, the Ra measurement is carried out with use of Surface Roughness Measuring Instrument SURFCORDER (Model SE500) manufactured by Kosaka Laboratory Ltd. under the following conditions: a stylus tip radius of 5 µm; a measurement length of 2.5 mm; and a cutoff value of 0.8 mm.

A clear illustration of the film 23 in FIG. 3B is just for the sake of clarity about the presence of the film 23, and hence the correlation in thickness between the base material 22 and the film 23 is not faithfully represented in FIG. 3B.

The film 23 is formed of a rare-earth element oxide, or a rare-earth element fluoride, or a rare-earth element oxyfluoride, or a rare-earth element nitride (oxides, fluorides, oxyfluorides, and nitrides will be hereinafter collectively called "compounds"). Examples of the rare-earth element include yttrium (Y), cerium (Ce), samarium (Sm), gadolinium (Gd), dysprosium (Dy), erbium (Er), and ytterbium (Yb). Yttrium, in particular, is highly resistant to corrosion yet less expensive than other rare-earth elements. Thus, the use of yttrium as the rare-earth element allows a high degree of cost effectiveness to be achieved.

Examples of compositional formulae for yttrium compounds include $Y_2O_{3-x}$ (0≤x≤1), $YF_3$, YOF, $Y_5O_4F_7$, $Y_5O_6F_7$, $Y_6O_5F_8$, $Y_7O_6F_9$, $Y_{17}O_{14}F_{23}$, and YN.

The film 23 is not limited to those containing rare-earth element compounds only. Depending on the purity of a target used in a film 23-forming process, the device structure, etc., the film 23 may contain other elements than the rare-earth element, such as fluorine (F), sodium (Na), magnesium (Mg), aluminum (Al), silicon (Si), phosphorus (P), sulfur (S), chlorine (Cl), potassium (K), calcium (Ca), titanium (Ti), chromium (Cr), manganese (Mn), iron (Fe), cobalt (Co), nickel (Ni), copper (Cu), zinc (Zn), and strontium (Sr). The constituents of the film 23 may be identified by using X-ray diffractometer for thin films.

Examples of the base material 22 include quartz, aluminum with a purity of 99.999% (5N) or more, an aluminum alloy such as aluminum 6061 alloy, aluminum nitride ceramics, and aluminum oxide ceramics. As to the aluminum nitride ceramics and the aluminum oxide ceramics, for example, the aluminum oxide ceramics refers to ceramics including an aluminum oxide content, i.e. the content of $Al_2O_3$-equivalent Al, of 90% by mass or more based on 100% by mass of the constituents of the base material 22 in all. Note that the aluminum oxide ceramics may contain magnesium oxide, calcium oxide, silicon oxide, etc. in addition to aluminum oxide.

The film 23 is provided with a plurality of pores, and a value A obtained by subtracting an average equivalent circle diameter of the pores from an average distance between centroids of adjacent pores is 28 µm or more and 48 µm or less.

The value A falling in the range of 28 µm or more to 48 µm or less indicates that the number of pores is small, the pore size is small, and the pores are dispersed. That is, in the plasma processing device member 21 that fulfills the aforestated design conditions, fewer particles are generated from within the pores. Moreover, even if a microcrack originates in a certain pore, nearby pores sufficiently dispersed as to block the propagation of the microcrack help reduce the number of particles resulting from microcrack propagation.

Moreover, in the plasma processing device member 21 according to the disclosure, the area occupancy of the plurality of pores in the film 23 may be 1.5% by area or more and 6% by area or less. With the area occupancy of the pores falling in the range of 1.5% by area or more and 6% by area or less, even if a microcrack appears at the surface to be exposed to plasma (including a part of the film which becomes exposed as a fresh surface due to a decrease in film thickness under exposure to plasma), the pores serve to block the propagation of the microcrack, with the consequent reduced number of microcrack-caused particles. Moreover, the low area occupancy of the pores present in the surface to be exposed to plasma is conducive to further reduction in the number of particles generated from within the pores.

Moreover, in the plasma processing device member 21 according to the disclosure, an average pore spheroidization rate in the film 23 may be 60% or more. With the pore spheroidization rate falling in this range, residual stress is less likely to accumulate around the pores, with the consequent reduction of generation of particles from around the pores under exposure to plasma.

As used herein the pore spheroidization rate is a conversion of a rate defined by the graphite area method, and is defined by the following mathematical expression (1):

$$\text{pore spheroidization rate (\%)} = (\text{pore actual area})/(\text{area of minimum circumscribed circle of pore}) \times 100 \quad (1).$$

The average pore spheroidization rate is preferably 62% or more.

Moreover, the average distance between the centroids of the pores, the average equivalent circle diameter of the pores, the area occupancy of the pores, and the pore spheroidization rate are determined in the following manner.

First, the surface of the film under a digital microscope at 100-fold magnification is observed, and an image of a 7.68 mm$^2$ area of the surface under observation (3.2 mm in transverse length and 2.4 mm in longitudinal length) is taken by a CCD camera. The image is subjected to image analysis using Image Analysis Software "AZO-KUN (Ver 2.52)" (trademark) manufactured by Asahi Kasei Engineering Corporation (in what follows, the term "Image Analysis Software "AZO-KUN"'" refers to the image analysis software manufactured by Asahi Kasei Engineering Corporation throughout the description) to measure the average distance between the centroids of the pores by means known as the inter-centroid distance method for dispersivity measurement.

Moreover, the average equivalent circle diameter of the pores, the area occupancy of the pores, and the pore spheroidization rate may be determined through the analysis of the same image as the described observed image by means known as the particle analytical method using Image Analysis Software "AZO-KUN". A part of the observed image which corresponds to the pore appears to be a dark spot which is easily discernible.

For example, measurements using the inter-centroid distance method and the particle analytical method are carried out under the following conditions: a threshold, used as a measure of image brightness, of 140; an image lightness of low level; an area for small-figure removal of 1 $\mu m^2$; and application of a denoising filter. While the threshold set for the described measurements is 140, the value of the threshold may be adjusted according to the brightness of the observed image. That is, after setting the lightness at a low level, selecting a manual image binarization mode, setting the area for small-figure removal at 1 $\mu m^2$, and applying a denoising filter, threshold adjustment is carried out so that the shape of a marker whose size varies according to the value of the threshold can coincide with pore shape in the observed image.

Moreover, in the plasma processing device member 21 according to the disclosure, a kurtosis Ku1 of equivalent circle diameters of the plurality of pores in the film 23 may be 0.5 or more and 2 or less. With the kurtosis Ku1 of the equivalent circle diameters of the pores falling in this range, the equivalent circle diameters of the pores are narrowly distributed, and also the number of pores having extraordinarily large equivalent circle diameters is small. This produces the effect of retarding microcrack propagation, reduces the number of particles generated from within the pores, and provides superior plasma resistance. Moreover, in a grinding process subsequent to film formation, the film 23 made to fulfill the aforestated design conditions may be given desired surface properties in a minimum grinding amount on the strength of its imperviousness to partial wear. The kurtosis Ku1 is preferably 1.3 or more and 1.9 or less.

As used herein the kurtosis Ku1 refers to an index (statistic) indicating how much a peak and tails of the distribution differ in the normal distribution. When the kurtosis Ku1>0, the distribution becomes a leptokurtic distribution having a sharp-pointed peak and longer and heavier tails. When the kurtosis Ku1=0, the distribution becomes the normal distribution. When the kurtosis Ku1<0, the distribution becomes a platykurtic distribution having a rounded peak and shorter and thinner tails. The kurtosis Ku1 of the equivalent circle diameters of the pores may be obtained by measurement using the function Kurt provided in Excel (registered trademark) manufactured by Microsoft Corporation.

Moreover, in the plasma processing device member 21 according to the disclosure, a skewness Sk1 of the equivalent circle diameters of the plurality of pores in the film 23 may be 3 or more and 5.6 or less. With the skewness Sk1 of the equivalent circle diameters of the pores falling in this range, the value of the average equivalent circle diameter of the pores is small, and the number of pores having extraordinarily large equivalent circle diameters is also small. This produces the effect of retarding microcrack propagation, reduces the number of particles generated from within the pores, and provides superior plasma resistance. Moreover, in a grinding process subsequent to film formation, the film 23 made to fulfill the aforestated design conditions may be given desired surface properties in a minimum grinding amount on the strength of its imperviousness to partial wear. The skewness Sk1 is preferably 3.2 or more and 5.3 or less.

As used herein the skewness Sk1 refers to an index (statistic) indicating how much the distribution is distorted from the normal distribution, in other words, an index indicating the bilateral symmetry of the distribution. When the skewness Sk1>0, the distribution becomes a skewed distribution with its tail shifted rightward. When the skewness Sk1=0, the distribution becomes a bilaterally symmetric distribution. When the skewness Sk1<0, the distribution becomes a skewed distribution with its tail shifted leftward. The skewness Sk1 of the equivalent circle diameters of the pores may be obtained by measurement using the function SKEW provided in Excel (registered trademark) manufactured by Microsoft Corporation.

Moreover, in the plasma processing device member 21 according to the disclosure, a kurtosis Ku2 of distances between centroids of the pores in the film 23 may be 0.1 or more and 0.5 or less. With the kurtosis Ku2 of the distances between the centroids of the pores falling in this range, the distances between the centroids are narrowly distributed, and also extraordinarily long distances between the centroids are small. This provides the effect of retarding microcrack propagation, and also reduces uneven distribution of residual stress.

Moreover, in the plasma processing device member 21 according to the disclosure, a skewness Sk2 of the distances between centroids of the pores in the film 23 may be 0.5 or more and 1 or less.

Moreover, a relative density of the film 23 may be 98% or more, or in particular may be 99% or more. The film 23 having the relative density falling in this range is a dense film which suffers little particle generation even when undergoing thickness reduction under exposure to plasma. In determining the relative density of the film 23, an actually measured film density is first obtained by X-ray Reflectometry (XRR) using X-ray diffractometer for thin films, and the ratio of the actually measured density to a theoretical density is then derived.

As described earlier, the area occupancy of the pores is preferably 1.5% by area or more and 6% by area or less. Meanwhile, the relative density of the film 23 is preferably 98% or more. There seems to be no correlation between the area occupancy of the pores and the relative density of the film 23. This is because the area occupancy of the pores is determined through image analysis, whereas the film relative density is determined by XRR. XRR allows X-rays to pass through the film 23 for measurement. In some cases, a part of the film 23 where a pore-bearing part and a pore-free part are overlapped in the direction of X-ray transmission is judged as a "pore-free region". On this account slightly higher-than-normal levels of the relative density of the film 23 may be detected in XRR measurement.

Thus, the plasma processing device member 21 according to the disclosure is less prone to particle generation, and a plasma processing device provided with the plasma processing device member 21 is highly reliable correspondingly.

The following describes a method of manufacturing a plasma processing device member according to the disclosure.

A method for producing the base material will be described first.

Aluminum oxide ($Al_2O_3$) A powder having an average particle size of 0.4 μm to 0.6 μm, and aluminum oxide B powder having an average particle size of about 1.2 μm to 1.8 μm are prepared. Silicon oxide ($SiO_2$) powder as a Si source, and calcium carbonate ($CaCO_3$) powder as a Ca source are also prepared. As the silicon oxide powder, fine powdery silicon oxide having an average particle size of 0.5 μm or less is prepared. Moreover, magnesium hydroxide powder is used to obtain Mg-containing alumina ceramics. Note that other powdery materials than the aluminum oxide A powder and the aluminum oxide B powder will be hereinafter collectively called "first secondary component powder".

A predetermined amount of each first secondary component powder is weighed out. After that, an aluminum oxide powder mixture is prepared from the aluminum oxide A powder and the aluminum oxide B powder in the amounts weighed out so that a mixture composed of the aluminum oxide A powder and the aluminum oxide B powder in mass proportions ranging from 40:60 to 60:40 can be obtained, and that the resulting alumina ceramics contains Al, as an $Al_2O_3$-equivalent aluminum, in an amount of 99.4% by mass or more based on 100% by mass of the alumina ceramics constituents in all. Moreover, for preparation of the first secondary component powder, preferably, on the basis of the measured amount of Na in the aluminum oxide powder mixture, certain amounts of the first secondary component powder are weighed out so that the amount ratio between $Na_2O$ derived by conversion of the Na amount and the sum of the constituents of the first secondary component powder (Si, Ca, etc. in this exemplification) on an oxide basis stands at or below 1.1 in the resulting alumina ceramics.

Then, a slurry is prepared by mixing and stirring, in a stirrer, the alumina powder mixture and the first secondary component powder, with the following components added: 1 to 1.5 parts by mass of a binder such as PVA (polyvinyl alcohol); 100 parts by mass of a solvent; and 0.1 to 0.55 parts by mass of a dispersant, based on 100 parts by mass of the alumina powder mixture and the first secondary component powder in all.

The slurry is spray-dried into granules, and the granules are shaped into a molded body of desired shape by a powder press molding apparatus, an isostatic pressing apparatus or the like. The molded body is subjected to cutting work on an as needed basis. Thus, a molded product in substrate form is obtained.

Subsequently, the molded product is fired while being retained under the following conditions: a firing temperature of 1500° C. or higher and 1700° C. or lower; and the duration of retention time of four hours or longer and six hours or shorter. After that, the molded product is ground at a surface thereof where the film 23 is to be formed by using diamond abrasive grains having an average particle size of 1 μm or more and 5 μm or less, and a tin-made surface grinder. Thus, the base material 25 can be obtained.

Figure 4:
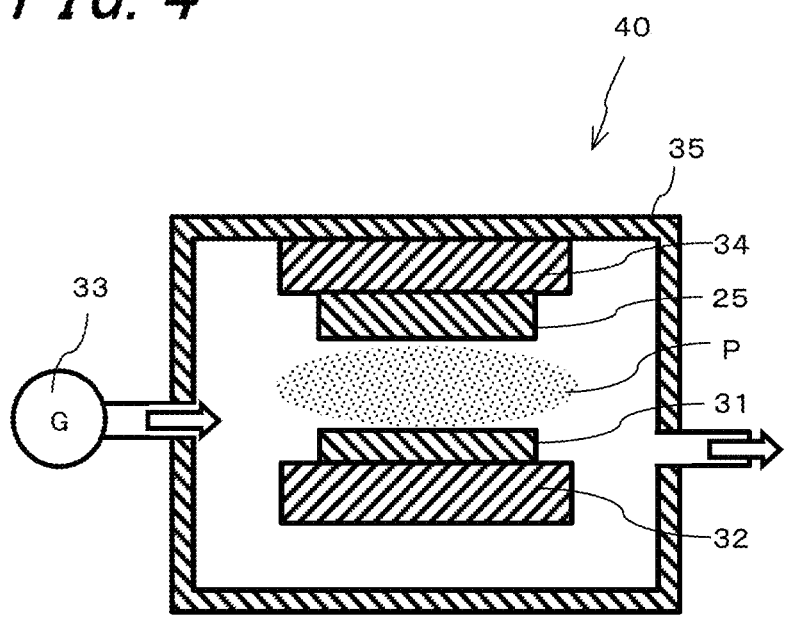
FIG. 4 is a schematic diagram of a sputtering apparatus used to obtain the plasma processing device member in accordance with another embodiment of the disclosure.

Next, a method for forming the film will be described with reference to FIG. 4. FIG. 4 is a schematic diagram showing a sputtering apparatus 40, and the sputtering apparatus 40 includes: a chamber 35; a gas supply source 33 connected in communication with the interior of the chamber 35; an anode 34 and a cathode 32 which are disposed within the chamber 35; and a target 31 connected to the cathode 32 side.

A procedure for forming the film is as follows. The base material 25 obtained in the above-described manner is placed on the anode 34 side within the chamber 35. Moreover, the target 31 including, as a main component, a rare-earth element, or more specifically yttrium metal in this example, is placed on the opposite side, i.e. on the cathode 32 side, within the chamber 35. In this state, the interior of the chamber 35 is brought under a reduced pressure by the operation of a vacuum pump, and, the gas supply source 33 supplies argon and oxygen as a gas G.

After that, a film of yttrium metal is formed on the surface of the base material 25 by sputtering in the presence of plasma P generated with the application of an electric field between the anode 34 and the cathode 32 via a power supply. A film portion formed in one operation has a thickness on the order of subnanometers. Subsequently, the yttrium metal film is subjected to an oxidizing process. A laminate having a total film thickness of 10 μm or more and 200 μm or less is produced by alternately carrying out the yttrium metal film-forming process and the oxidizing process. Thus, the plasma processing device member including the resulting film of the yttrium oxide according to the disclosure is obtained.

In order to obtain the plasma processing device member in which the area occupancy of the plurality of pores is 1.5% by area or more and 6% by area or less, the area occupancy of pores at the film-facing surface of the base material should preferably be 1% by area or more and 5% by area or less.

Moreover, in order to obtain the plasma processing device member in which the average spheroidization rate of the plurality of pores is 60% or more, the average spheroidization rate of the pores at the film-facing surface of the base material should preferably be 62% or more.

Moreover, in order to obtain the plasma processing device member in which the kurtosis Ku of the equivalent circle diameters of the plurality of pores is 0.5 or more and 2 or less, the kurtosis Ku of the equivalent circle diameters of the pores at the film-facing surface of the base material should preferably be 0.6 or more and 1.8 or less.

Moreover, in order to obtain the plasma processing device member in which the skewness Sk of the equivalent circle diameters of the plurality of pores is 3 or less and 5.6 or less, the skewness Sk of the equivalent circle diameters of the pores at the film-facing surface of the base material should preferably be 3.1 or less and 5.4 or less.

Moreover, in order to form a film of yttrium fluoride, the yttrium metal film should preferably be subjected to a fluoridizing process instead of the oxidizing process.

Moreover, in order to form a film of yttrium oxyfluoride, a laminate should preferably be obtained by alternately carrying out the yttrium metal film-forming process, the oxidizing process and the fluoridizing process in the order named.

Moreover, in order to form a film of yttrium nitride, the yttrium metal film should preferably be subjected to a nitriding process instead of the oxidizing process.

Any of high-frequency power and DC power may be used as electric power which is provided via the power supply.

The plasma processing device member according to the disclosure obtained by the above-described manufacturing method achieves reduction of both of the number of particles generated from within the pores and the number of particles resulting from microcrack propagation, and is thus applicable to, for example, a radio-frequency transmissive window member that allows radio-frequency radiation for plasma generation to pass therethrough, a shower plate for distribution of gas for plasma production, and a susceptor for holding semiconductor wafers.

The disclosure may be embodied in other specific forms without departing from the spirit or essential characteristics thereof. The present embodiments are therefore to be considered in all respects as illustrative and not restrictive, the scope of the disclosure being indicated by the appended claims rather than by the foregoing description and all changes which come within the meaning and the range of equivalency of the claims are therefore intended to be embraced therein. For example, inventive combinations of the embodiments according to the disclosure are also considered as coming within the scope of the disclosure.

REFERENCE SIGNS LIST

1: First layer (lower layer)
2: Second layer (upper layer)
3: Film
4: Open pores
5: Base material
6: Closed pores
7: Recess
8: Cavity
10: Plasma processing device member
11: Target
12: Cathode
13: Gas supply source
14: Anode
15: Chamber
20: Sputtering apparatus

The invention claimed is:

1. A plasma processing device member, comprising:
a base material; and
a film formed of an oxide, or fluoride, or oxyfluoride, or nitride of a rare-earth element, the film being disposed on at least part of the base material,
the film comprising a surface to be exposed to plasma, the surface having an area occupancy of open pores of 8% by area or less, and an average diameter of open pores of 8 µm or less,
wherein the film is provided with a cavity which extends in a thickness direction of the film from a recess located at a surface of the base material which faces the film, and the cavity terminates within the film.

2. The plasma processing device member according to claim 1,
wherein the film is configured so that a region of the film in which the average diameter of open pores is 8 µm or less and the area occupancy of open pores from the surface of the film is 8% by area or less constitutes 5% or more of an entire thickness dimension of the film.

3. The plasma processing device member according to claim 1,
wherein a width at a part of the cavity which is located close to the surface of the film is smaller than a width at a part of the cavity which is located close to the recess of the base material, as viewed in a section taken along a thickness of the film.

4. The plasma processing device member according to claim 1,
wherein the rare-earth element comprises yttrium.

5. The plasma processing device member according to claim 4,
wherein the base material is formed of ceramics comprising aluminum oxide as a main component, and comprises, in a top of a surface of the base material which surface faces the film, at least one of yttrium aluminum garnet (YAG), yttrium aluminum monoclinic (YAM), and yttrium aluminum perovskite (YAP).

6. A plasma processing device, comprising:
the plasma processing device member according to claim 1.

7. A method of manufacturing a plasma processing device member according to claim 1, comprising:
forming a first layer comprising an yttrium oxide as a main component on a base material by a sputtering method;
applying smoothing processing to a film formation surface of the first layer; and
forming a second layer comprising an yttrium oxide as a main component on a smoothing-processed surface of the first layer by a sputtering method.

* * * * *